(12) United States Patent
Mori et al.

(10) Patent No.: US 8,759,166 B2
(45) Date of Patent: Jun. 24, 2014

(54) METHOD FOR MANUFACTURING THIN FILM TRANSISTOR DEVICE

(75) Inventors: Hiroki Mori, Osaka (JP); Masaki Saitoh, Osaka (JP); Takumi Tomita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 251 days.

(21) Appl. No.: 13/515,683

(22) PCT Filed: Dec. 13, 2010

(86) PCT No.: PCT/JP2010/072387
§ 371 (c)(1),
(2), (4) Date: Jun. 28, 2012

(87) PCT Pub. No.: WO2011/074537
PCT Pub. Date: Jun. 23, 2011

(65) Prior Publication Data
US 2012/0282741 A1    Nov. 8, 2012

(30) Foreign Application Priority Data
Dec. 14, 2009    (JP) .................................. 2009-283226

(51) Int. Cl.
*H01L 21/00* (2006.01)
*H01L 21/84* (2006.01)
(52) U.S. Cl.
USPC .......................... 438/151; 438/153; 438/154
(58) Field of Classification Search
CPC ................... H01L 27/127; H01L 27/1222

USPC .......................................... 438/151, 153, 154
See application file for complete search history.

(56) References Cited

U.S. PATENT DOCUMENTS

| 6,025,629 | A | 2/2000 | Ipposhi et al. |
| 7,015,081 | B2 * | 3/2006 | Hotta ............................ 438/151 |
| 7,312,483 | B2 * | 12/2007 | Kurosawa ..................... 257/164 |
| 2002/0098635 | A1 | 7/2002 | Zhang et al. |
| 2003/0160245 | A1 | 8/2003 | Kurosawa |
| 2004/0063257 | A1 * | 4/2004 | Zhang et al. .................. 438/154 |

FOREIGN PATENT DOCUMENTS

| JP | 8-186265 A | 7/1996 |
| JP | 9-293868 A | 11/1997 |
| JP | 2000-196096 A | 7/2000 |
| JP | 2003-258262 A | 9/2003 |
| JP | 2008-166597 A | 7/2008 |

\* cited by examiner

*Primary Examiner* — Thien F Tran
(74) *Attorney, Agent, or Firm* — Chen Yoshimura LLP

(57) ABSTRACT

Disclosed is a method of manufacturing a thin film transistor device that includes the following steps: forming slanted portions 51 in edges of crystalline semiconductor films 13 (13a and 13b); forming a resist film 15 on the crystalline semiconductor film 13a so as to expose the slanted portions 51 and so as to cover the entire crystalline semiconductor film 13b; performing half exposure of the resist film 15 that is formed on the crystalline semiconductor film 13a; injecting a p-type impurity only into the slanted portions 51 of the crystalline semiconductor film 13a; removing the resist film 15 that is formed on the crystalline semiconductor film 13a by ashing; and injecting the p-type impurity into the entire crystalline semiconductor film 13a.

5 Claims, 8 Drawing Sheets

(a)

(b)

(a)

(b)

110: Glass substrate (c)

(a) n-type TFT formation region (b) p-type TFT formation region (a)

(b)

(c)

METHOD FOR MANUFACTURING THIN FILM TRANSISTOR DEVICE

TECHNICAL FIELD

The present invention relates to a method of manufacturing a thin film transistor device provided in a display panel and the like.

BACKGROUND ART

In recent years, a demand for liquid crystal display panels and the like as flat panel displays has been growing rapidly. Compared to a CRT (Cathode Ray Tube), the liquid crystal display panels consume less power, and can be made smaller with ease. Therefore, the liquid crystal display panels have been widely used in televisions, mobile phones, portable game devices, in-vehicle navigation devices, and the like.

Furthermore, an organic EL (Electro Luminescence) display panel, which consumes even less power than the liquid crystal display panels, has been developed, and has already been put to practical use in some products.

Among these liquid crystal display panels and organic EL display panels, an active matrix type display panel that has fast response speed and that can perform multiple gradation display in a simple manner is widely used.

In the active matrix type display panel, generally, a plurality of pixels are arranged in a matrix, and thin film transistors (Thin Film Transistors, hereinafter referred to as "TFTs") are provided in the respective pixels as switching elements.

A basic configuration of a TFT is described with reference to FIG. 5.

In FIG. 5, a configuration of the TFT is illustrated. FIG. 5(a) is a plan view showing the configuration of the TFT. FIG. 5(b) is a cross-sectional view along the line I-I in FIG. 5(a). FIG. 5(c) is a cross-sectional view along the line II-II in FIG. 5(a).

As shown in FIG. 5, on a glass substrate as an insulating substrate 110, a silicon oxide film, which is a base insulating film 111, is formed. On a TFT formation region on the base insulating film 111, a polysilicon film is formed as a semiconductor film 112.

On the base insulating film 111 and the semiconductor film 112, a silicon oxide film is formed as a gate insulating film 113. On the gate insulating film 113, a gate electrode 114 made of a metal is formed. The gate electrode 114 is formed so as to traverse the semiconductor film 112.

The semiconductor film 112 includes a pair of high concentration impurity regions (source region and drain region) 112a and 112b that are formed by implanting a p-type or n-type impurity using the gate electrode 114 as a mask.

Here, in a case of a reverse stagger type TFT, the locations of the gate electrode 114 and the semiconductor film 112 are reversed.

It has been known that in a TFT that includes the semiconductor film 112 made of a polysilicon film and the gate insulating film 113 made of a silicon oxide film as described above, if an impurity is not added to a channel region of the semiconductor film 112, a threshold voltage shifts in a negative direction.

To solve this problem, a method of controlling the threshold voltage by injecting a p-type impurity such as boron (B) into the entire semiconductor film 112 before forming the gate electrode 114 has been proposed.

The methods of injecting the p-type impurity into the semiconductor film 112 include an ion implantation method, an ion doping method, and a gas doping method, for example. In the ion implantation method, only ions of the desired element are implanted into the semiconductor film after performing mass separation. In the ion doping method, the mass separation is not performed, and the impurity is implanted into the semiconductor film by acceleration. The ion doping methods include a method in which a material gas such as diborane ($B_2H_6$) is excited by RF (Radio Frequency) power to generate boron ions and these boron ions are accelerated to energy of several keV to 100 keV to be implanted into the semiconductor film, for example. The gas doping methods include a method of forming an amorphous silicon film that contains boron (B) by mixing a diborane ($B_2H_6$) gas into a silane ($SiH_4$) gas, which is the material gas, in forming amorphous silicon on the base insulating film by the plasma CVD (Chemical Vapor Deposition) method, for example.

In a driver circuit of the liquid crystal display panel or the organic EL display panel, a CMOS Complementary Metal Oxide Semiconductor) that includes a p-type TFT and an n-type TFT is widely used. When the CMOS is used, unless the threshold voltage is adjusted such that the p-type TFT and the n-type TFT are both turned off when the gate voltage is 0V, a leakage current occurs, which increases power consumption. Particularly, in the current circumstances in which reduction of power consumption is desired, the threshold voltage of the TFT needs to be reduced so as to minimize the driver voltage.

However, the current-voltage characteristics of the n-type TFT and the p-type TFT are different, and therefore, it is difficult to adjust the threshold voltage such that both the p-type TFT and the n-type TFT are turned off when the gate voltage is 0V. This issue is described below.

Generally, in the TFT, in order to secure a dielectric breakdown voltage of the gate insulating film 113, edges of the semiconductor film 112 are processed so as to be inclined as shown in FIG. 5(c). Therefore, when the p-type impurity is implanted by one of the methods described above, the surface density of the p-type impurity per unit area becomes lower in the slanted portions of the channel region than that of the p-type impurity per unit area in the central portion of the channel region.

As a result, as shown in FIG. 6, in the n-type TFT, the slanted portions form a parasitic transistor having a small channel width and a low threshold voltage. This causes the actual current that flows in the TFT to have combined characteristics of the characteristics of the planarized portion and the characteristics of the slanted portions, which exhibit two-step characteristics. On the other hand, in the p-type TFT, the characteristics of the slanted portions are masked by the characteristics of the planarized portion, and therefore, the characteristics of the slanted portions do not affect the threshold voltage. FIG. 6 is a graph showing the current-voltage (I-V) characteristics of the p-type TFT and the n-type TFT.

The current-voltage characteristics of the n-type TFT and the p-type TFT are described in more detail with reference to FIG. 4.

FIG. 4(a) shows the current-voltage (I-V) characteristics of the n-type TFT. FIG. 4(b) shows the current-voltage (I-V) characteristics of the p-type TFT.

As indicated by a solid line in the graph of FIG. 4(a), the n-type TFT is affected by the parasitic transistor of the slanted portions, causing the drain current to change in two steps when driving up near the gate voltage of 0V. On the other hand, the p-type TFT is not affected by the parasitic transistor because the characteristics of the slanted portions does not exceed the characteristics of the planarized portion, and therefore, as indicated by the solid line in the graph of FIG. 4(b), the drain current near the gate voltage of 0V changes in one step.

As described, the current-voltage characteristics of the n-type TFT and the p-type TFT are different from each other. When a CMOS is formed of the n-type TFT and the p-type TFT having these characteristics, it is difficult to control the injection amount of the p-type impurity such that both the p-type TFT and the n-type TFT are turned off when the gate voltage is 0V.

In order to solve this problem, Patent Document 1 describes a method of manufacturing a TFT substrate.

FIG. 7 is a cross-sectional view showing the method of manufacturing a TFT substrate described in Patent Document 1.

Below, an example of the method of manufacturing a TFT substrate is described with reference to FIG. 7. FIG. 7(a) shows a cross-sectional configuration of an n-type TFT formation region in the TFT substrate. FIG. 7(b) shows a cross-sectional configuration of a p-type TFT formation region in the TFT substrate.

As shown in FIGS. 7(a) and 7(b), first, on a glass substrate as an insulating substrate 241, a silicon oxide film, which is a base insulating film 242, is formed.

Next, on the base insulating film 242, an amorphous silicon film containing boron (B), which is a p-type impurity, is formed as an amorphous semiconductor film. Next, the entire upper surface of the insulating substrate 241 is irradiated with an excimer laser to crystallize the amorphous semiconductor film, thereby turning it into a crystalline semiconductor film 243. In other words, the amorphous silicon film is turned into a polysilicon film.

Then, a mask film 244 formed of a silicon oxide film, for example, is formed on the crystalline semiconductor film 243.

Next, using a positive type photoresist, a resist film (not shown in the figure) is formed on the mask film 244 in a TFT formation region.

Then, etching is performed so as to form the mask film 244 and the crystalline semiconductor film 243 into an island shape. Here, edges of the resist film are slanted such that the width of the resist film becomes narrower generally from the bottom portion toward the upper portion. The slanted portions are etched to recede gradually, which forms slanted portions in the edges of the crystalline semiconductor film 243.

Next, the resist film is removed by a removal liquid or plasma ashing.

Then, a resist film R4 is formed so as to cover the p-type TFT formation region completely (see FIG. 7(b)). Here, the resist film R4 is not formed in the n-type TFT formation region (see FIG. 7(a)).

Next, using an ion doping device, boron (B) is implanted into the entire crystalline semiconductor film 243 in the n-type TFT formation region by setting the conditions such that boron (B) passes through the mask film 244. At this time, boron (B) is not implanted into the p-type TFT formation region because it is covered by the resist film R4.

Next, after changing the conditions such that boron is blocked by the mask film 244, boron is implanted into the slanted portions of the crystalline semiconductor film 243 in the n-type TFT formation region. This way, in the n-type TFT formation region, the p-type impurity is selectively implanted only into the slanted portions of the crystalline semiconductor film 243, which are exposed from the mask film 244. This makes it possible to suppress the effects of the parasitic transistor in the slanted portions in the n-type TFT.

Then, the resist film R4 is removed, and a gate insulating film and a gate electrode are formed on the crystalline semiconductor film 243.

RELATED ART DOCUMENTS

Patent Documents

Patent Document 1: Japanese Patent Application Laid-Open Publication, "Japanese Patent Application Laid-Open Publication No. 2003-258262 (published on Sep. 12, 2003)

SUMMARY OF THE INVENTION

Problems to be Solved by the Invention

However, in the method of manufacturing TFTs described in Patent Document 1, two types of masks, which are the resist film R4 and the mask film 244, are needed so as to adjust the amounts of impurity to implant into the n-type TFT formation region and the p-type TFT formation region, and to adjust the amounts of impurity to implant into the slanted portions and the planarized portion of the n-type TFT formation region. This creates a problem of requiring extra steps and masks as compared with the existing method of manufacturing a thin film transistor.

Further, Patent Document 1 describes that, in the method of manufacturing TFTs disclosed therein, it is possible to leave the mask film 244 as a portion of the gate insulating film after implanting the p-type impurity if the mask film 244 is formed of an insulating film such as a silicon oxide film.

However, when the mask film 244 is left and the gate insulating film is formed thereon, the thickness of the insulating layer becomes thinner in the slanted portions of the crystalline semiconductor film 243 than that in the planarized portion, which affects the dielectric breakdown voltage of the slanted portions. In other words, the dielectric breakdown voltage in the slanted portions becomes lower than that of the planarized portion.

Also, as the miniaturization of the process is further developed, inclined angles of the slanted portions of the crystalline semiconductor film 243 become steeper and the gate insulating film becomes even thinner, and consequently, the dielectric breakdown voltage of the slanted portions becomes even lower. Therefore, when elements are microfabricated, the mask film 244 cannot be left, and a removing step is needed without exception, thereby causing a problem of increasing the number of steps.

The present invention seeks to address the problems described above, and has an object of providing a method of manufacturing a thin film transistor device that allows a thin film transistor in which the threshold voltage can be controlled with ease to be manufactured in the fewer number of steps and that can be also applied in a microfabrication process.

Means for Solving the Problems

In order to solve the problems described above, the method of manufacturing a thin film transistor device according to the present invention is a method of manufacturing a thin film transistor device that includes a p-type thin film transistor and an n-type thin film transistor. The method includes the following steps: (a) forming a first semiconductor film that is an active layer of the n-type thin film transistor and a second semiconductor film that is an active layer of the p-type thin film transistor such that their edges have slanted portions, respectively; (b) forming a resist film on the first semiconductor film so as to expose the slanted portions and so as to cover the second semiconductor film in its entirety; (c) performing half exposure of the resist film formed on the first semiconductor film to reduce the film thickness thereof; (d) injecting a p-type impurity only into the slanted portions of the first semiconductor film; (e) removing the resist film formed on the first semiconductor film; and (f) injecting the p-type impurity into the first semiconductor film in its entirety.

According to the manufacturing method described above, it is possible to inject a greater amount of p-type impurity into a channel region of the first semiconductor film than into a channel region of the second semiconductor film. Furthermore, it is possible to inject a greater amount of p-type impurity into the slanted portions of the channel region of the first semiconductor film than into a planarized portion (portion excluding the slanted portions) of the channel region.

Therefore, when the gate voltage is 0V, both the n-type thin film transistor and the p-type thin film transistor are turned off. As a result, the leakage current of the CMOS is reduced, thereby reducing power consumption.

Furthermore, according to the manufacturing method above, by changing the film thickness of one type of resist film, the resist film formed on the first semiconductor film can be removed selectively, and the amounts of impurity to be implanted into the first semiconductor film, which is the active layer of the n-type thin film transistor, and into the second semiconductor film, which is the active layer of the p-type thin film transistor, can therefore be adjusted. Further, in the manufacturing method above, it is possible to adjust the amounts of impurity to be implanted into the slanted portions and the planarized portion of the semiconductor layer in the n-type thin film transistor by forming the resist film such that the slanted portions of the first semiconductor film are exposed. In the manufacturing method of the present invention, because the method of forming the resist film is improved as described above, it is possible to manufacture a thin film transistor in which the threshold voltage can be controlled with ease without requiring an extra step or mask as compared with an existing method of manufacturing a thin film transistor.

In the method of manufacturing a thin film transistor device of the present invention, half exposure of the resist film is performed in the step (c).

According to the manufacturing method above, it is possible to reduce the film thickness of the resist film formed on the first semiconductor film in a simple manner. In other words, it is possible to pattern a resist film on the second semiconductor film to a prescribed film thickness and to pattern a resist film on the first semiconductor film to a smaller film thickness than that of the resist film formed on the second semiconductor film in a single photolithography process.

Furthermore, by using the half exposure, it is possible to reduce the film thickness of resist film using existing equipment with minimal increase in the number of steps.

Effects of the Invention

The present invention is a method of manufacturing a thin film transistor device formed of a p-type thin film transistor and an n-type thin film transistor that includes the following steps: (a) forming a first semiconductor film that is an active layer of the n-type thin film transistor and a second semiconductor film that is an active layer of the p-type thin film transistor such that their edges have slanted portions; (b) forming a resist film on the first semiconductor film so as to expose the slanted portions and so as to cover the entire second semiconductor film; (c) reducing the thickness of the resist film formed on the first semiconductor film; (d) injecting a p-type impurity only into the slanted portions of the first semiconductor film; (e) removing the resist film formed on the first semiconductor film; and (f) injecting the p-type impurity into the entire first semiconductor film.

Thus, according to the present invention, it is possible to manufacture a thin film transistor in which the threshold voltage can be controlled with ease in a fewer steps. The present invention can be also applied in a microfabrication process.

BRIEF DESCRIPTION OF THE DRAWINGS

FIG. 3(a) is a plan view of the CMOS-TFT according to an embodiment of the present invention. FIG. 3(b) shows cross-sectional views along the line I-I and the line I'-I' in FIG. 3(a). FIG. 3(c) is a cross-sectional view along the line II-II in FIG. 3(a).

FIG. 4(a) is a graph showing the current-voltage (I-V) characteristics of an n-type TFT. FIG. 4(b) is a graph showing the current-voltage (I-V) characteristics of a p-type TFT.

FIG. 5(a) is a plan view showing a configuration of the conventional TFT. FIG. 5(b) is a cross-sectional view along the line I-I in FIG. 5(a). FIG. 5(c) is a cross-sectional view along the line II-II in FIG. 5(a).

DETAILED DESCRIPTION OF EMBODIMENTS

Embodiment 1

Embodiment 1 of the present invention is described below with reference to figures. In embodiments below, a case in which TFTs (thin film transistors) according to the present invention are employed in a liquid crystal display device will be described as an example.

Overall Configuration of Liquid Crystal Display Device

First, an overall configuration of the liquid crystal display device in this embodiment is described.

Figure 2:
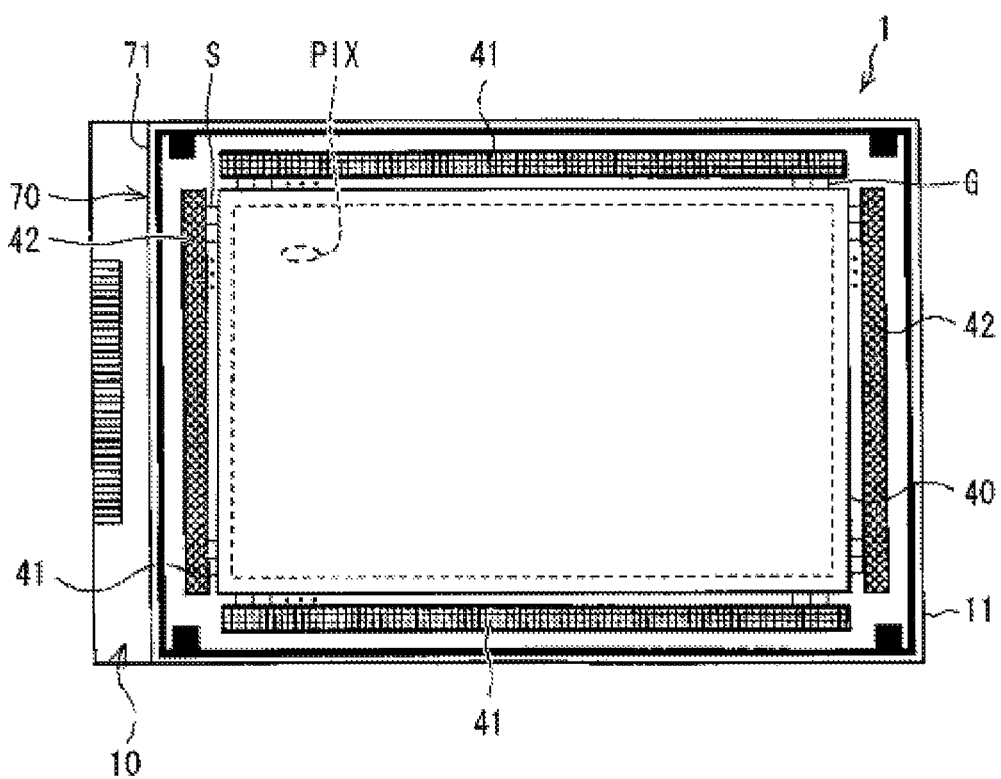
FIG. 2 is a plan view showing an overall configuration of a liquid crystal display device according to an embodiment of the present invention.

FIG. 2 is a plan view showing an overall configuration of the liquid crystal display device of this embodiment.

As shown in FIG. 2, a liquid crystal display device 1 is constituted of a TFT substrate 10 and a CF substrate 70 that are disposed so as to face each other and a liquid crystal element (not shown in the figure) that is sealed between the TFT substrate 10 and the CF substrate 70.

In the TFT substrate 10, on a glass substrate as an insulating substrate 11, a display section 40, gate signal line driver circuits 41, and data signal line driver circuits 42 are formed.

In the display section 40, a plurality of gate wiring lines G and a plurality of source wiring lines S are arranged so as to intersect with each other, and pixels PIX that are provided corresponding to the intersections of the respective gate wiring lines G and the respective source wiring lines S are arranged in a matrix.

The gate signal line driver circuits 41 sequentially output a scan signal that selects the pixels PIX for writing data signals to the respective gate wiring lines G, thereby driving the gate wiring lines G.

The data signal line driver circuits 42 output data signals to the respective source wiring lines S, thereby driving the source wiring lines S.

In the respective pixels PIX, either n-type TFTs or p-type TFTs are provided as switching elements. The respective pixels PIX are controlled by receiving gate signals from the gate wiring lines G and data signals from the source wiring lines S.

Further, a plurality of CMOS-TFTs (thin film transistors) 30 (see FIG. 3) are respectively provided in the gate signal line driver circuits 41 and the data signal line driver circuits 42 for high-speed driving.

On the other hand, in the CF substrate 70, a black matrix, a color filter, and the like are formed on an insulating substrate 71 that is a glass substrate.

Configuration of CMOS-TFT

Next, a configuration of the CMOS-TFT formed on the TFT substrate 10 is described in detail with reference to FIG. 3.

Figure 3:
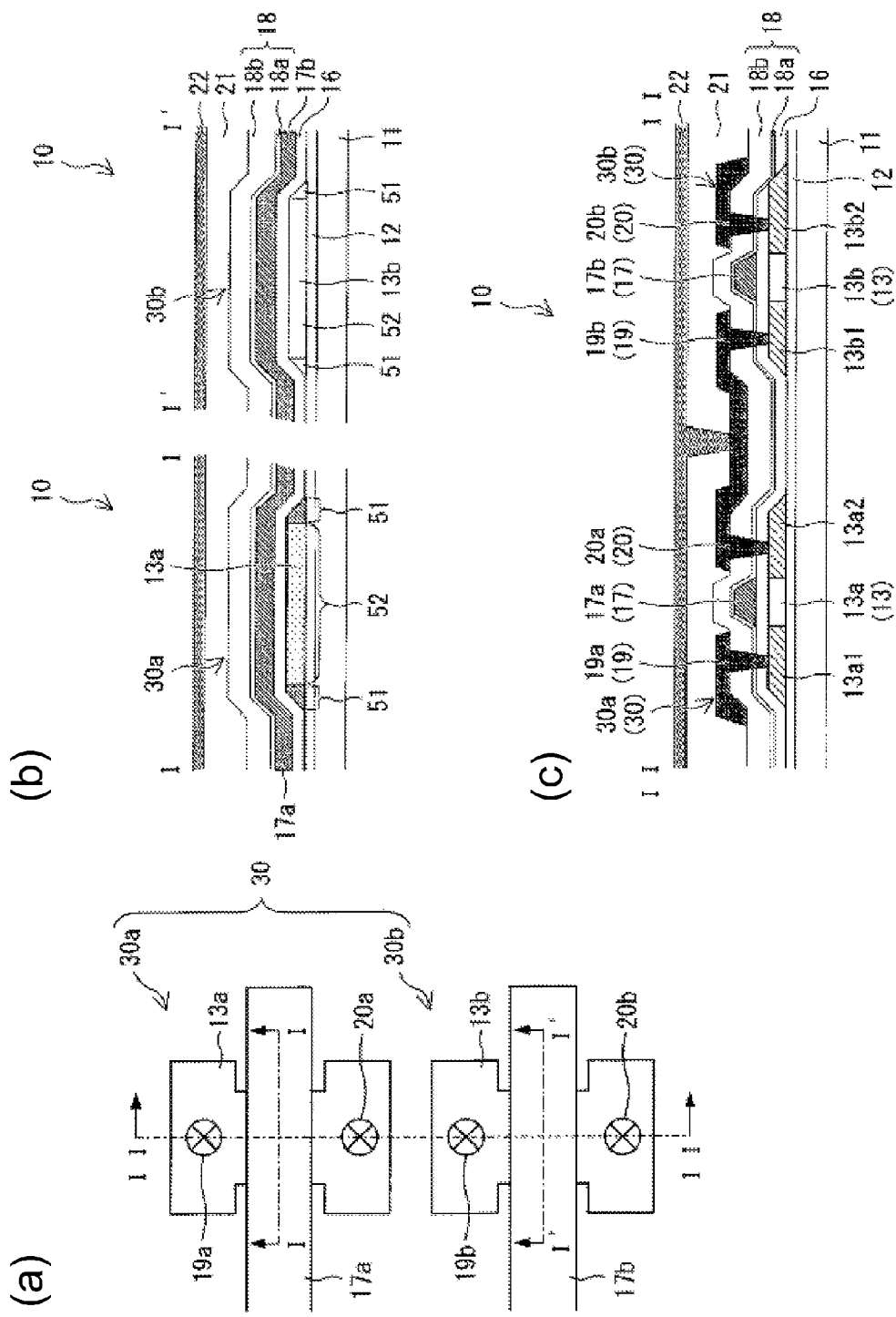
FIG. 3 is a drawing showing a configuration of a CMOS-TFT according to an embodiment of the present invention.

FIG. 3 illustrates a configuration of the CMOS-TFTs in the gate signal line driver circuit 41 and the data signal line driver circuit 42 provided on the TFT substrate 10. FIG. 3(a) is a plan view of the CMOS-TFT. FIG. 3(b) shows cross-sectional views along the line I-I and the line I'-I' in FIG. 3(a). FIG. 3(c) is a cross-sectional view along the line II-II in FIG. 3(a).

As shown in FIG. 3(c), in the TFT substrate 10, a CMOS-TFT 30 that includes an n-type TFT 30a and a p-type TFT 30b is formed on the insulating substrate 11 that is a glass substrate through a base insulating film 12 that is a silicon oxide film.

Specifically, on prescribed regions on the base insulating film 12, a polysilicon film is formed in island shapes as crystalline semiconductor films 13 (13a and 13b) that are active layers of the CMOS-TFT 30. In the crystalline semiconductor film 13a that is the active layer of the n-type TFT 30a, a pair of high concentration impurity regions (source region and drain region) 13a1 and 13a2 are formed with a channel region therebetween. In the crystalline semiconductor film 13b that is the active layer of the p-type TFT 30b, a pair of high concentration impurity regions (source region and drain region) 13b1 and 13b2 are formed with a channel region therebetween.

A gate insulating film 16 is formed on the crystalline semiconductor film 13, and gate electrodes 17 (17a and 17b) are formed on the gate insulating film 16. Here, the gate electrodes 17a and 17b are formed so as to traverse the crystalline semiconductor films 13a and 13b, respectively (see FIG. 3(a)).

On the gate insulating film 16 and the gate electrodes 17, first interlayer insulating films 18 (18a and 18b) are formed. On the first interlayer insulating films 18, source electrodes 19 (19a and 19b) and drain electrodes 20 (20a and 20b) are formed. Here, the source electrode 19a and the drain electrode 20a are electrically connected to the high concentration impurity regions (source region and drain region) 13a1 and 13a2 formed in the crystalline semiconductor film 13a, respectively, through contact holes formed in the first interlayer insulating films 18. The source electrode 19b and the drain electrode 20b are electrically connected to the high concentration impurity regions (source region and drain region) 13b1 and 13b2 formed in the crystalline semiconductor film 13b, respectively, through contact holes formed in the first interlayer insulating films 18.

A second interlayer insulating film 21 is formed on the first interlayer insulating films 18, the source electrodes 19, and the drain electrodes 20. On the second interlayer insulating film 21, an electrode film 22 that is formed of a transparent conductor such as ITO (Indium Tin Oxide), for example, is formed. The electrode film 22 can be formed at the same time as the pixel electrodes provided in the respective pixels PIX using the same material.

The electrode film 22 is connected to the source electrode 19b and the drain electrode 20a through a contact hole formed in the second interlayer insulating film 21.

In the edges of the crystalline semiconductor films 13a and 13b, slanted portions 51 (see FIG. 3(b)) are respectively formed to secure a dielectric breakdown voltage.

In the channel regions of the crystalline semiconductor films 13a and 13b, boron (B), which is a p-type impurity, is added for threshold control. Here, the amounts of the p-type impurity added to the channel region of the crystalline semiconductor film 13a (first semiconductor film), which is the active layer of the n-type TFT 30a, and to the channel region of the crystalline semiconductor film 13b (second semiconductor film), which is the active layer of the p-type TFT 30b, are different from each other. Specifically, the amount of the p-type impurity added to the channel region of the crystalline semiconductor film 13a is larger than the amount of the p-type impurity added to the channel region of the crystalline semiconductor film 13b. Further, the amount of the p-type impurity added to the slanted portions 51 of the channel region of the crystalline semiconductor film 13a is larger than the amount of the p-type impurity added to a planarized portion 52 (portion excluding the slanted portions) of the channel region.

This way, when the gate voltage is 0V, both the n-type TFT 30a and the p-type TFT 30b are turned off. As a result, the leakage current of the CMOS-TFT 30 is reduced, thereby reducing power consumption.

Specific reasons therefor are described below with reference to the current-voltage (I-V) characteristics of the CMOS-TFT.

Current-voltage (I-V) Characteristics of CMOS-TFTs

Figure 4:
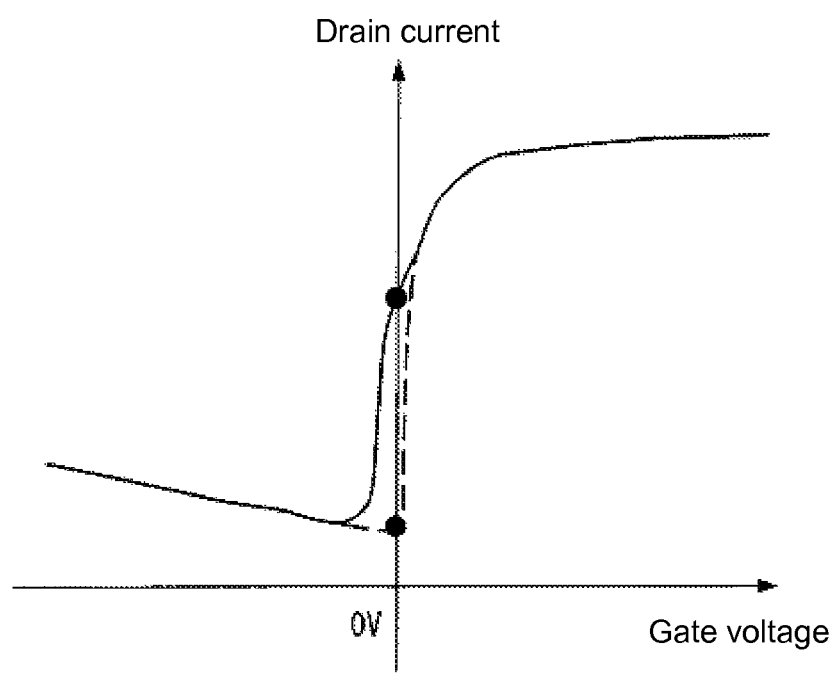
FIG. 4 shows graphs showing current-voltage (I-V) characteristics of CMOS-TFTs according to an embodiment of the present invention.
Figure 4:
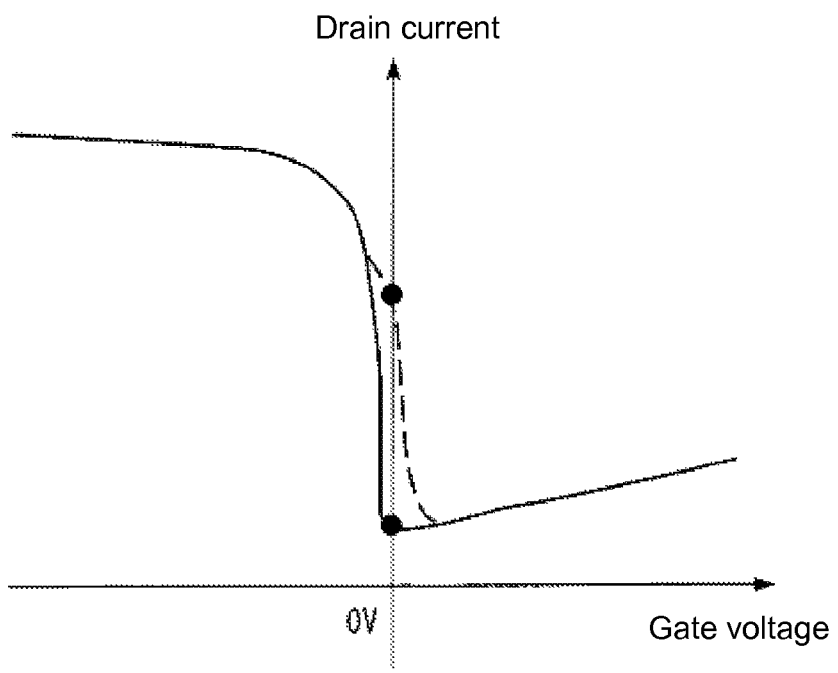
Figure 5:
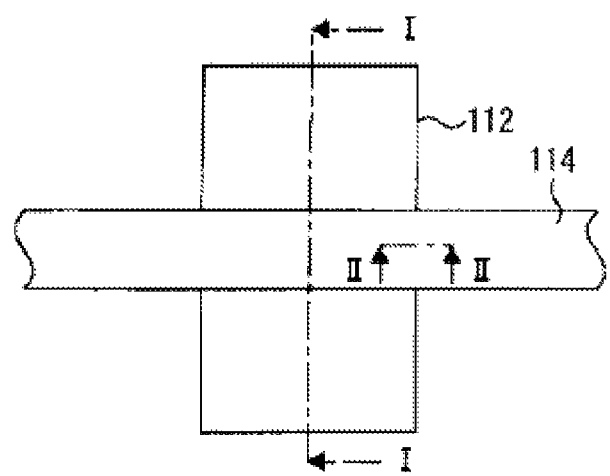
FIG. 5 is a drawing showing a configuration of a conventional TFT.
Figure 5:
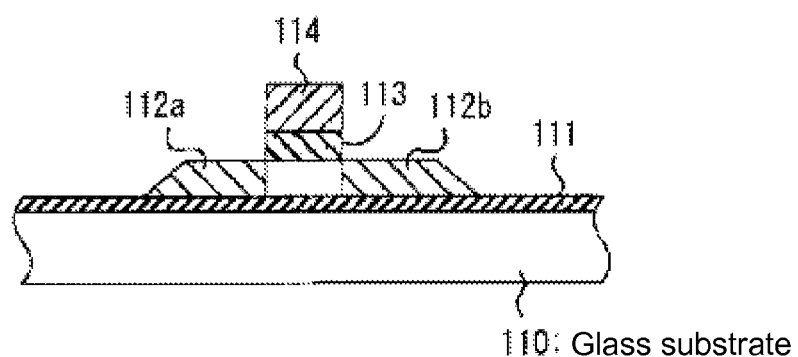
Figure 5:
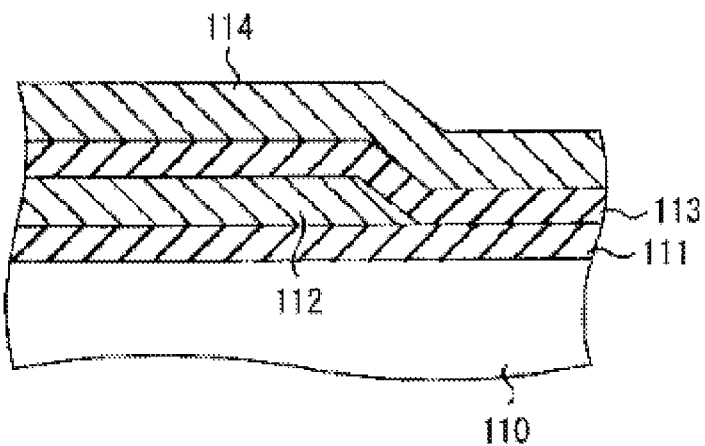

FIG. 4 shows graphs illustrating the current-voltage (I-V) characteristics of the CMOS-TFT of this embodiment. FIG. 4(a) shows the current-voltage (I-V) characteristics of the n-type TFT, and FIG. 4(b) shows the current-voltage (I-V) characteristics of the p-type TFT.

The solid line in the graph in FIG. 4(a) shows the I-V characteristics of a conventional n-type TFT in which the amounts of p-type impurity added to the slanted portions and the planarized portion are not adjusted in the manner described above. As shown in the figure, the conventional n-type TFT is affected by the parasitic transistor in the slanted portions 51, which causes the drain current to change in two steps when driving up near the gate voltage of 0V.

In the present invention, a greater amount of p-type impurity is injected into the slanted portions 51 of the channel region of the n-type TFT 30a as compared with the planarized portion 52. This way, it is possible to adjust the threshold of the parasitic transistor formed in the slanted portions 51 of the channel region so as to substantially match the threshold of the TFT in the planarized portion 52. As a result, as indicated by the dashed line in FIG. 4(a), the bump (stepwise change) in the I-V characteristics of the n-type TFT is eliminated.

Figure 6:
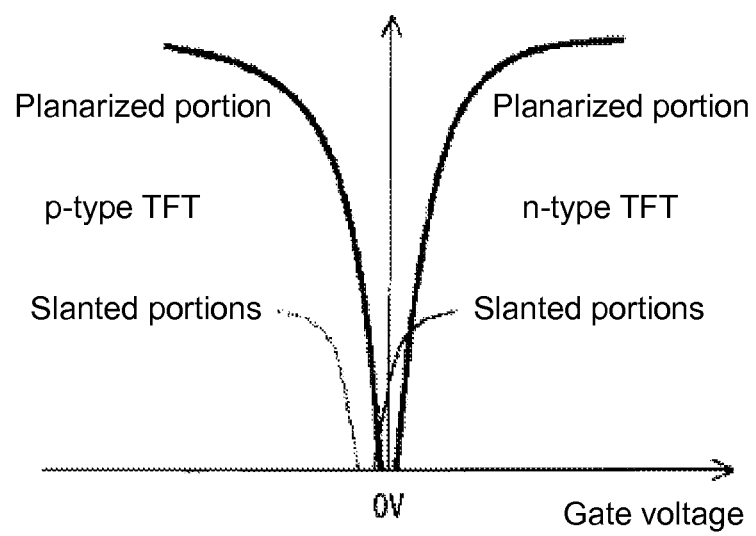
FIG. 6 is a graph showing current-voltage (I-V) characteristics of a conventional TFT.
Figure 7:
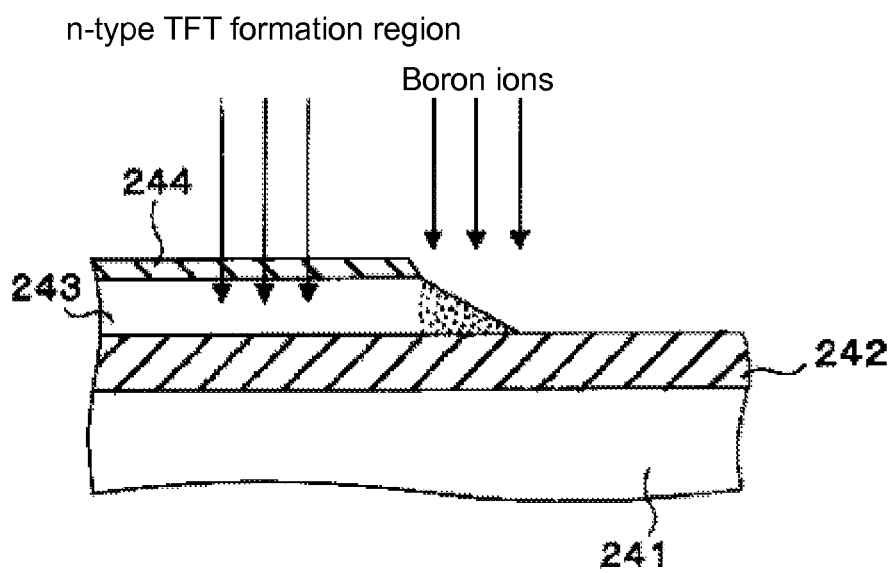
FIG. 7 is a cross-sectional view showing a method of manufacturing a TFT substrate described in Patent Document 1.
Figure 7:
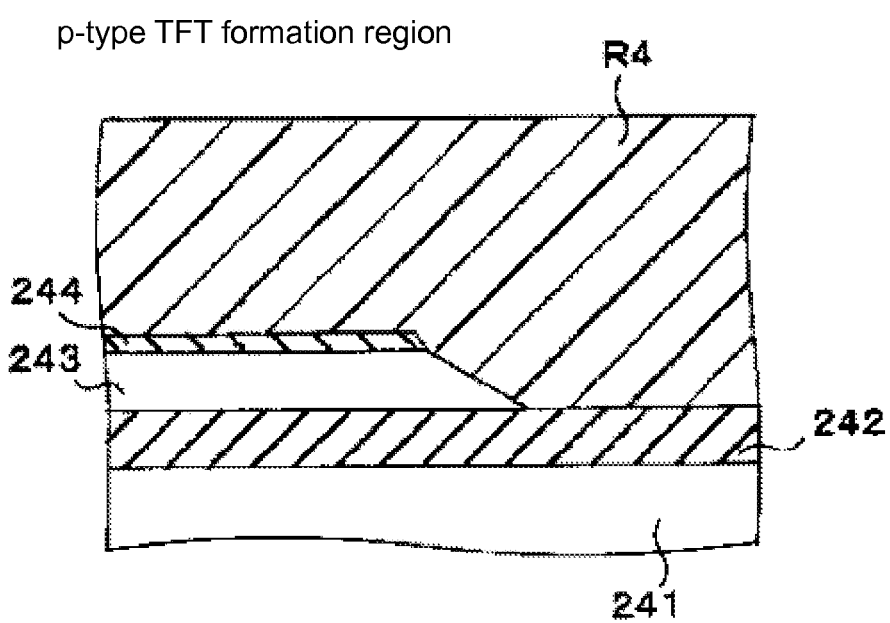

On the other hand, in the p-type TFT, the characteristics of the slanted portions do not exceed the characteristics of the planarized portion (see FIG. 6), and therefore, the p-type TFT is not affected by the parasitic transistor. Consequently, as indicated by the solid line in the graph of FIG. 4(b), the drain current near the gate voltage of 0V changes in one step. However, if a greater amount of p-type impurity is injected into the slanted portions of the channel region of the p-type TFT than into the planarized portion, the characteristics of the slanted portions of the p-type TFT would change. As a result, the effect of the parasitic transistor would be more significant, and as indicated by the dashed line in FIG. 4(b), a gradual change would occur in the I-V characteristics of the p-type TFT.

Therefore, in the present invention, the same amount of p-type impurity is injected into the planarized portion 52 and the slanted portions 51 of the channel region of the p-type TFT 30b.

The reason for injecting a greater amount of p-type impurity into the channel region of the crystalline semiconductor film 13a than into the channel region of the crystalline semiconductor film 13b is known (Japanese Patent Application Laid-Open Publication No. 2000-196096), and will not be described further.

Threshold Voltage of N-Type TFT

Next, the current-voltage (I-V) characteristics of an n-type TFT that is manufactured by the method of the present invention are described in more detail. Here, the description is given in comparison with the current-voltage (I-V) characteristics of an n-type TFT that is manufactured by a conventional method.

Recently, with the increasing demand for lower power consumption, a reduction in a threshold voltage Vth of the TFTs, which can achieve a reduction in the driving voltage, is sought after.

However, if the threshold voltage Vth of the TFT is reduced by more than a prescribed value, the TFTs would become normally-on, which increases the power consumption.

Therefore, a reference value P needs to be set for an off leakage current of the TFTs, and the threshold voltage Vth of the TFTs needs to be controlled such that the reference value P is not exceeded. The minimum value of the threshold voltage Vth of the TFTs, which ensures that the off leakage current stays below the reference value P, is defined as the lower limit specification.

Here, the off leakage current is equal to the drain current when the gate voltage of the TFT is 0V.

Figure 8:
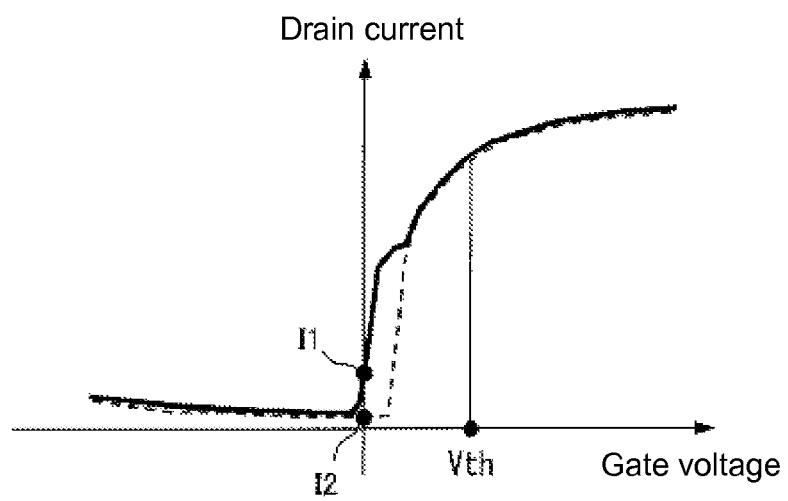
FIG. 8 shows graphs showing current-voltage (I-V) characteristics of an n-type TFT according to an embodiment of the present invention.
Figure 8:
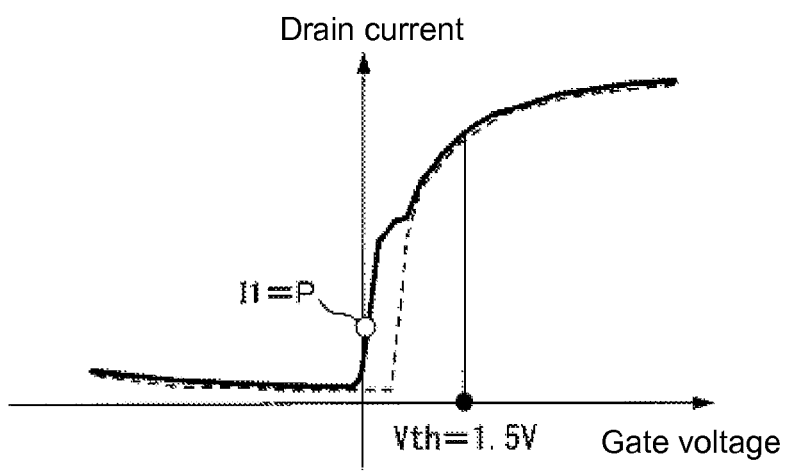
Figure 8:
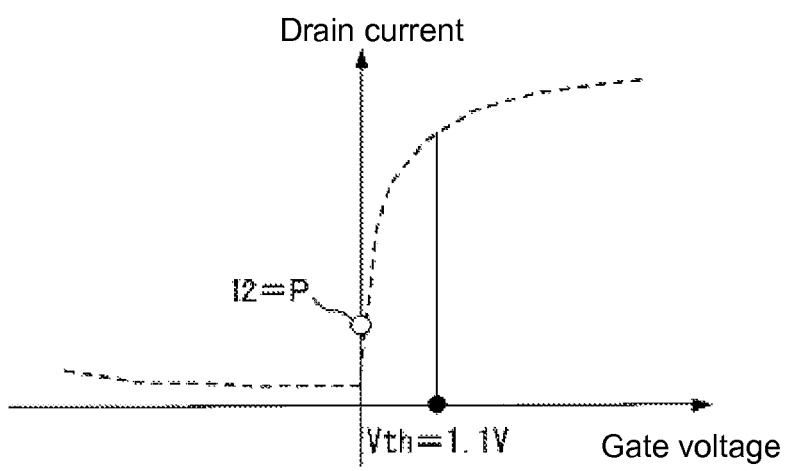

FIG. 8 shows graphs illustrating the current-voltage (I-V) characteristics of n-type TFTs. In the graphs of FIG. 8, the solid lines show the I-V characteristics of a conventional n-type TFT, which is affected by the parasitic transistor. The dashed lines show the I-V characteristics of the n-type TFT of the present invention, which is not affected by the parasitic transistor.

As shown in FIG. 8(a), when the threshold voltage Vth of the TFT is constant, the off leakage current I1 of the conventional TFT, which is affected by the parasitic transistor, is larger than the off leakage current I2 of the TFT of the present invention, which is not affected by the parasitic transistor.

The off leakage current is increased when the threshold voltage Vth of the TFTs is shifted to the negative side.

As shown in FIG. 8(b), in the conventional TFT, the off leakage current I1 equals the reference value P when the threshold voltage Vth of the TFT is 1.5V, for example. In this case, when the threshold voltage Vth of the TFT is shifted to the negative side and falls below 1.5V, the off leakage current I1 exceeds the reference value P. Therefore, in this conventional TFT, the lower limit specification is 1.5V.

On the other hand, the TFT of the present invention has the current-voltage (I-V) characteristics shown in FIG. 8(c). In this case, when the threshold voltage Vth of the TFT is 1.1V, for example, the off leakage current I2 equals the reference value P. That is, when the threshold voltage Vth of the TFT is shifted to the negative side and falls below 1.1V, the off leakage current I2 exceeds the reference value P. Therefore, in the TFT of the present invention, the lower limit specification becomes 1.1V, and the lower limit specification can be lowered as compared with the conventional TFT.

That is, by injecting a greater amount of p-type impurity into the slanted portions 51 of the channel region of the n-type TFT than into the planarized portion 52 thereof, effects of the parasitic transistor can be eliminated, which allows the lower limit specification of the threshold voltage Vth of the n-type TFT to be reduced.

This is advantageous for reducing power consumption.

Method of Manufacturing CMOS-TFT

Figure 1:
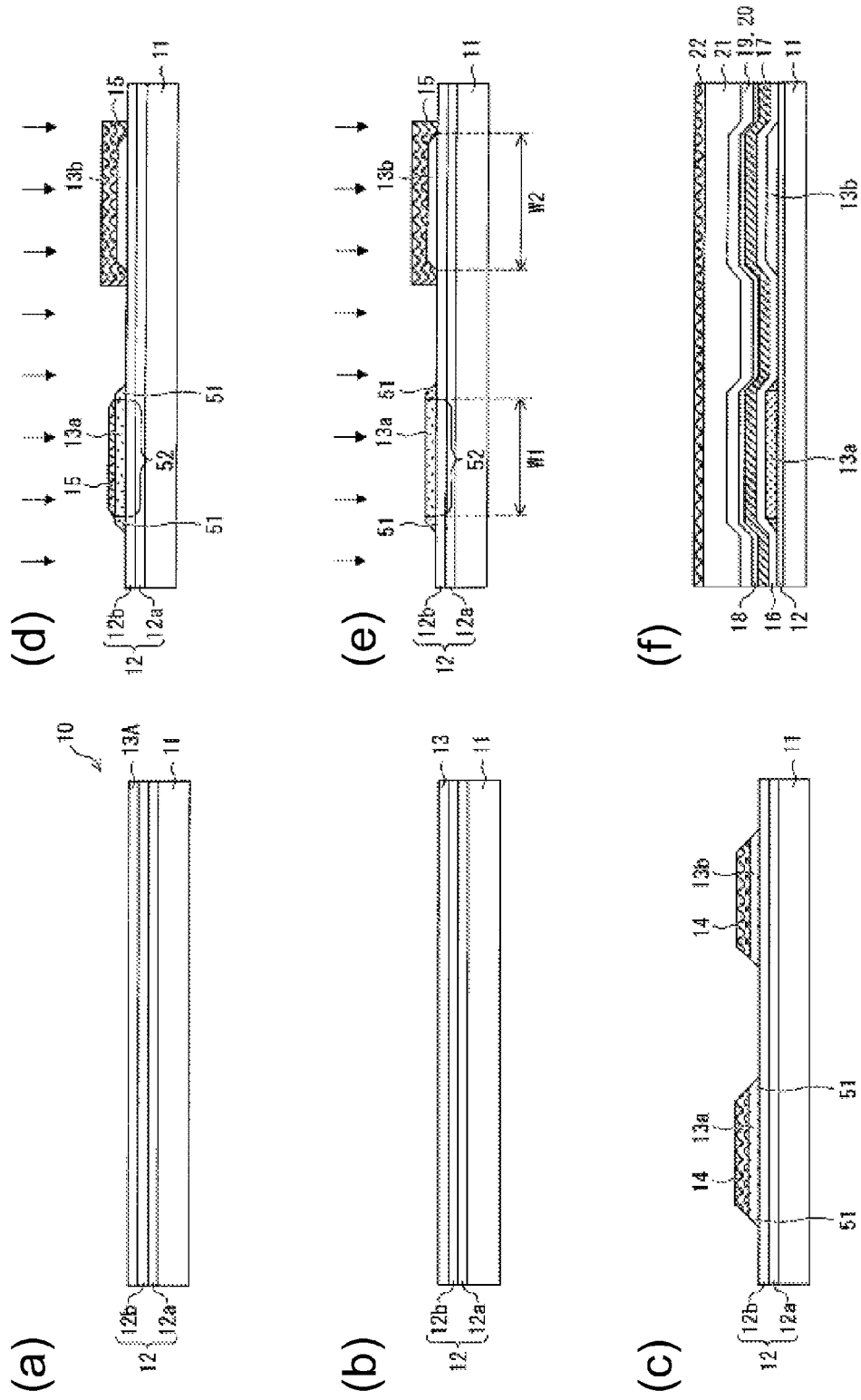
FIG. 1 is a cross-sectional view showing a method of manufacturing CMOS-TFTs according to an embodiment of the present invention in the order of steps.

A method of manufacturing a CMOS-TFT having the configuration described above is described with reference to FIG. 1.

FIGS. 1(a) to 1(f) are cross-sectional views showing a method of manufacturing a CMOS-TFT according to the process sequence.

First, as shown in FIG. 1(a), on the insulating substrate 11 that is a glass substrate, a laminate of a silicon nitride film 12a and a silicon oxide film 12b is formed as the base insulating film 12 by the plasma CVD (Chemical Vapor Deposition) method or sputtering, for example.

Here, a transparent glass substrate is used as the insulating substrate 11, however, the present invention is not limited thereto, and other than the glass substrate, a substrate formed of quartz, plastic, or the like may be used.

As the base insulating film 12, a multilayer film formed of the silicon nitride film 12a and the silicon oxide film 12b is used here. However, the present invention is not limited thereto, and an inorganic insulating film containing silicon, such as a single layer of a silicon oxide film, a silicon nitride film, or a silicon nitride oxide film, or a multilayer film of these films, may be used, for example. Here, in order to effectively suppress diffusion of impurity ions from the insulating substrate 11, the base insulating film 12 preferably is an inorganic insulating film containing nitrogen such as a silicon nitride film or a silicon nitride oxide film.

Next, on the base insulating film 12, an amorphous silicon film is formed as an amorphous semiconductor film 13A by the plasma CVD method or the like.

Next, as shown in FIG. 1(b), the entire amorphous semiconductor film 13A is irradiated with XeCL excimer laser light having a wavelength of 308 nm so as to be crystallized. A polysilicon film as a crystalline semiconductor film 13 is formed this way.

Here, the method of crystallizing the amorphous semiconductor film 13A is not limited to the method described above. The amorphous semiconductor film 13A may be crystallized using KrF excimer laser light having a wavelength of 248 nm, for example.

Next, as shown in FIG. 1(c), a positive-type photoresist is applied on the crystalline semiconductor film 13 to form a resist film 14. Then, the resist film 14 is patterned using the photolithography technique (Photo Engraving Process). Using the patterned resist films 14 as etching masks, the crystalline semiconductor film 13 is dry-etched into island-shapes to form the crystalline semiconductor film 13a of an n-type TFT region and the crystalline semiconductor film 13b of a p-type TFT region. In the edges of the crystalline semiconductor film 13 (13a and 13b), the slanted portions 51 are formed so as to secure the dielectric breakdown voltage.

As the etching gas, a $CF_4$ gas and an oxygen gas can be used, for example. As the flow amount of the oxygen gas is increased, the more of the resist film 14 is removed in etching. This makes it possible to change the angle of the slanted portions of the crystalline semiconductor film 13 by adjusting the flow amount of the oxygen gas.

After patterning the crystalline semiconductor film 13, the resist films 14 are removed using a removal liquid or plasma ashing.

Next, as shown in FIG. 1(d), on the crystalline semiconductor films 13, resist film 15 is formed, and is patterned so as to completely cover the planarized portion 52 of the crystalline semiconductor film 13a that is the active layer of the n-type TFT 30a, and the entire crystalline semiconductor film 13b that is the active layer of the p-type TFT 30b, by the photolithography technique, for example. Then, the resist film 15 that covers the planarized portion 52 of the crystalline semiconductor film 13a undergoes half exposure to reduce the film thickness of the resist film 15 on the planarized portion 52. In this step of reducing the film thickness of the resist film 15, the film thickness of the resist film 15 is reduced to an extent that still allows the resist film 15 to block a p-type impurity from being implanted into the planarized portion 52 of the crystalline semiconductor film 13a.

The half exposure is also referred to as half-tone exposure. By performing the half exposure with respect to the resist film 15, it is possible to reduce the film thickness of the resist film in a simple manner using existing equipment.

Then, a p-type impurity such as boron (B), for example, is doped only into the slanted portions 51 of the crystalline semiconductor film 13a by the ion implantation method or the ion doping method (edge dope).

Next, as shown in FIG. 1(e), the resist film 15 that covers the planarized portion 52 of the crystalline semiconductor film 13a is removed by plasma ashing. Then, a p-type impurity such as boron (B), for example, is doped into the entire crystalline semiconductor film 13a by the ion implantation method or the ion doping method (channel dope). At this time, the crystalline semiconductor film 13b is covered by the resist film 15, and therefore, the p-type impurity is not added to the crystalline semiconductor film 13b.

Then, the resist film 15 on the entire surface of the insulating substrate 11 is removed by a removal liquid or plasma ashing. This way, the resist film 15 on the crystalline semiconductor film 13b is removed.

There is no special limitation on the dimensions of the crystalline semiconductor films of the respective TFTs formed in the steps above. However, a width w1 of the crystalline semiconductor film 13a in the n-type TFT region that excludes the edge dope regions may be formed to be the same as a width w2 of the crystalline semiconductor film 13b in the p-type TFT region.

Next, as shown in FIG. 1(f), the gate insulating film 16 is formed on the crystalline semiconductor films 13. Because the crystalline semiconductor films 13 are made of silicon, it is preferable to use a silicon oxide film as the gate insulating film 16 so as to reduce the interface state at the interface with the crystalline semiconductor films 13.

Then, in order to control the threshold voltages of the n-type TFT 30a and the p-type TFT 30b, a p-type impurity such as boron (B), for example, is doped into the entire surfaces of the crystalline semiconductor films 13a and 13b through the gate insulating film 16 by the ion implantation method or the ion doping method.

The p-type impurity is injected into the entire surfaces of the crystalline semiconductor films 13a and 13b through the gate insulating film 16. However, the present invention is not limited thereto, and it is also possible to form an amorphous silicon film containing boron (B) in the step of forming amorphous silicon that becomes the amorphous semiconductor film 13A by mixing a diborane ($B_2H_6$) gas into a silane gas ($SiH_4$), which is the material gas.

Next, on the gate insulating film 16, an aluminum film is formed as a conductive film by sputtering, for example. The conductive film is patterned into a desired shape by the photolithography technique to form the gate electrode 17.

Next, using the gate electrode 17 as a mask, impurities such as boron (B) and phosphorus (P) are doped by the ion implantation method or the ion doping method. Specifically, in the crystalline semiconductor film 13a, a highly concentrated n-type impurity such as phosphorus (P), for example, is implanted into both sides of the gate electrode 17 to form high concentration impurity regions (source region and drain region).

On the other hand, in the crystalline semiconductor film 13b, a highly concentrated p-type impurity such as boron (B), for example, is implanted into both sides of the gate electrode 17 to form high concentration impurity regions (source region and drain region).

According to this manufacturing method, the n-type TFT 30a and the p-type TFT 30b can be formed with a fewer number of steps.

Next, as the first interlayer insulating film 18, a laminate of a silicon nitride film 18a and a silicon oxide film 18b is formed by the plasma CVD (Chemical Vapor Deposition) method or sputtering, for example, so as to cover the n-type TFT 30a and the p-type TFT 30b.

Although a multilayer film formed of the silicon nitride film 18a and the silicon oxide film 18b is used as the first interlayer insulating film 18 here, the present invention is not limited thereto, and an inorganic insulating film containing silicon, such as a single layer of a silicon oxide film, a silicon nitride film, or a silicon nitride oxide film, or a multilayer film of these films, may be used.

Thereafter, contact holes that reach the high concentration impurity regions from the surface of the first interlayer insulating film 18 are formed.

Then, a multilayer film of Ti, Al, and Mo is formed as a metal film, for example. The metal film is patterned into a desired shape by the photolithography technique to form the source electrode 19 and the drain electrode 20. Here, the source electrode 19 and the drain electrode 20 are electrically connected to the high concentration impurity regions (source region and drain region) formed in the crystalline semiconductor film 13 through the contact holes formed in the first interlayer insulating film 18, respectively.

Then, as the second interlayer insulating film 21, a single layer of a silicon oxide film, a silicon nitride film, or a silicon nitride oxide film, or a multilayer film of these films, for example, is formed so as to cover the first interlayer insulating film 18, the source electrode 19, and the drain electrode 20.

Then, on the second interlayer insulating film 21, the electrode film 22 made of a transparent conductor such as ITO (Indium Tin Oxide), for example, is formed. The electrode film 22 can be formed at the same time as the pixel electrodes provided in the respective pixels PIX using the same material.

The electrode film 22 is electrically connected to the source electrode 19 and the drain electrode 20 through a contact hole formed in the second interlayer insulating film 21.

The CMOS-TFT 30 manufactured by the manufacturing method above can improve the characteristics of the n-type TFT without sacrificing the characteristics of the p-type TFT 30b by selectively performing edge dope only to the slanted portions of the n-type TFT 30a, thereby suppressing the effects of the parasitic transistor.

Further, the separate doping for the slanted portions 51 and for the planarized portion 52 is made possible only by performing the half exposure process and the subsequent ashing process to the resist film 15 that covers the crystalline semiconductor film 13a, which is the active layer of the n-type TFT 30a. This allows for easy control of the process, and the process can be performed using an existing ashing device with the minimum number of steps. Furthermore, this manufacturing method can be used for the microfabrication process.

Embodiment 2

A method of manufacturing a TFT substrate according to Embodiment 2 of the present invention is described. Here, components and the like that are similar to those of Embodiment 1 are given the same reference characters, and their descriptions are omitted.

First, as shown in FIG. 1(a), on the insulating substrate 11 that is a glass substrate, a laminate of the silicon nitride film 12a and the silicon oxide film 12b is formed as the base insulating film 12 by the plasma CVD (Chemical Vapor Deposition) method or sputtering, for example.

Next, on the base insulating film 12, an amorphous silicon film is formed as the amorphous semiconductor film 13A by the plasma CVD method or the like.

Next, as shown in FIG. 1(b), the crystalline semiconductor film 13 that is a polysilicon film is formed by irradiating the entire amorphous semiconductor film 13A with excimer laser light for crystallization.

Next, as shown in FIG. 1(c), a positive-type photoresist is applied on the crystalline semiconductor film 13 to form the resist film 14. Next, the resist film 14 is patterned by the photolithography technique (Photo Engraving Process). Using the patterned resist films 14 as etching masks, the crystalline semiconductor film 13 is dry-etched into island shapes to form the crystalline semiconductor film 13a of the n-type TFT region and the crystalline semiconductor film 13b of the p-type TFT region. In the edges of the crystalline semiconductor film 13, the slanted portions 51 are formed so as to secure the dielectric breakdown voltage.

Here, as the etching gas, a $CF_4$ gas and an oxygen gas can be used, for example. As the flow amount of the oxygen gas is increased, the more of the resist film 14 is removed by etching. This makes it possible to change the angle of the slanted portions of the crystalline semiconductor film 13 by adjusting the flow amount of the oxygen gas.

After patterning the crystalline semiconductor film 13, the resist films 14 are removed by a removal liquid or plasma ashing.

Next, the gate insulating film 16 is formed on the crystalline semiconductor film 13.

Next, on the gate insulating film 16, the resist film 15 is formed. The resist film 15 is patterned so as to completely cover the planarized portion 52 of the crystalline semiconductor film 13a, which is the active layer of the n-type TFT 30a, and the entire crystalline semiconductor film 13b, which is the active layer of the p-type TFT 30b, by the photolithography technique, for example. Then, the resist film 15 that covers the planarized portion 52 of the crystalline semiconductor film 13a undergoes half exposure to reduce the film thickness of the resist film 15 on the planarized portion 52. In this step of reducing the film thickness of the resist film 15, the film thickness of the resist film 15 is reduced to an extent that still allows the resist film 15 to block a p-type impurity from being implanted into the planarized portion 52 of the crystalline semiconductor film 13a. Then, the p-type impurity such as boron (B) is doped only into the slanted portions 51 of the crystalline semiconductor film 13a by the ion implantation method or the ion doping method (edge dope).

Next, the resist film 15 that covers the crystalline semiconductor film 13a is removed by plasma ashing. Then, a p-type impurity such as boron (B) is doped into the entire crystalline semiconductor film 13a by the ion implantation method or the ion doping method (channel dope). At this time, the crystalline semiconductor film 13b is covered by the resist film 15, and therefore, the p-type impurity is not added to the crystalline semiconductor film 13b.

Then, the resist film 15 on the entire surface of the insulating substrate 11 is removed by a removal liquid or plasma ashing.

Next, in order to control the threshold voltages of the n-type TFT 30a and the p-type TFT 30b, a p-type impurity such as boron (B) is doped into the entire surfaces of the crystalline semiconductor films 13a and 13b through the gate insulating film 16 by the ion implantation method or the ion doping method.

Although the p-type impurity is injected into the entire surfaces of the crystalline semiconductor films 13a and 13b through the gate insulating film 16 here, the present invention is not limited thereto. It is also possible to form an amorphous silicon film containing boron (B) in the step of forming amorphous silicon that becomes the amorphous semiconductor film 13A by mixing a diborane ($B_2H_6$) gas into a silane gas ($SiH_4$), which is the material gas.

Steps after this are the same as the steps of Embodiment 1. Therefore, their descriptions are omitted.

The present invention is not limited to the embodiments described above, and various modifications are possible within the scope described in the claims. Embodiments obtained by appropriately combining techniques that are respectively disclosed in different embodiments are also included in the technical scope of the present invention.

In the method of manufacturing a thin film transistor device of the present invention, it is preferable to use ashing in the step (e) described above.

When the resist film is removed by ashing, it is possible to selectively remove the resist film in a simple manner by utilizing a difference in film thicknesses of the resist films. Therefore, according to the manufacturing method above, it is possible to selectively remove the resist film that is formed on the first semiconductor film only in a simple manner.

Further, by using ashing, it is possible to remove the resist film using existing equipment with the minimal increase in the number of steps.

It is preferable that the method of manufacturing a thin film transistor device of the present invention further include the following steps: (g) removing the resist film formed on the second semiconductor film after the step (f); (h) forming a gate insulating film so as to cover the first semiconductor film and the second semiconductor film; and (i) injecting a p-type impurity into the entire surfaces of the first semiconductor film and the second semiconductor film through the gate insulating film.

It is preferable that the method of manufacturing a thin film transistor device of the present invention further include a step of injecting a p-type impurity into the entire surfaces of the first semiconductor film and the second semiconductor film through the gate insulating film after the step (h) and before the step (i).

According to the configuration above, by injecting the p-type impurity into the entire surfaces of the first semiconductor film and the second semiconductor film, it is possible to control the threshold voltages of the n-type thin film transistor and the p-type thin film transistor.

The method of manufacturing a thin film transistor device of the present invention may further include a step of forming a gate insulating film on the first semiconductor film and the second semiconductor film after the step (a) and before the step (b). In the step (b), the resist film may be formed on the first and second semiconductor films through the gate insulating film.

INDUSTRIAL APPLICABILITY

The present invention can be applied in display devices, such as a liquid crystal display device, an organic EL display device, and the like.

DESCRIPTION OF REFERENCE CHARACTERS 1 liquid crystal display device
10 TFT substrate
11 insulating substrate
12 base insulating film
12a silicon nitride film
12b silicon oxide film
13 crystalline semiconductor film
13A amorphous semiconductor film
13a crystalline semiconductor film (first semiconductor film)
13b crystalline semiconductor film (second semiconductor film)
14 resist film
15 resist film
16 gate insulating film
17 gate electrode
18 first interlayer insulating film
18a silicon nitride film
18b silicon oxide film
19 source electrode
20 drain electrode
21 second interlayer insulating film
22 electrode film
30 CMOS-TFT
30a n-type TFT
30b p-type TFT
40 display section
41 gate signal line driver circuit
42 data signal line driver circuit
70 CF substrate

The invention claimed is:

1. A method of manufacturing a thin film transistor device that includes a p-type thin film transistor and an n-type thin film transistor, the method comprising:
   (a) forming a first semiconductor film that is an active layer of said n-type thin film transistor and a second semiconductor film that is an active layer of said p-type thin film transistor such that their edges have slanted portions, respectively;
   (b) forming a resist film on said first semiconductor film so as to expose said slanted portions and so as to cover said second semiconductor film in its entirety;
   (c) performing half exposure of said resist film formed on said first semiconductor film to reduce a film thickness thereof;
   (d) injecting a p-type impurity only into said slanted portions of said first semiconductor film;
   (e) removing said resist film formed on said first semiconductor film; and
   (f) injecting the p-type impurity into said first semiconductor film in its entirety.

2. The method of manufacturing a thin film transistor device according to claim 1, wherein in said step (e), ashing is used.

3. The method of manufacturing a thin film transistor device according to claim 1, further comprising, after said step (f):
   (g) removing said resist film formed on said second semiconductor film;
   (h) forming a gate insulating film so as to cover said first semiconductor film and said second semiconductor film; and
   (i) forming gate electrodes on said gate insulating film.

4. The method of manufacturing a thin film transistor device according to claim 3, further comprising injecting the p-type impurity into entire surfaces of said first and second semiconductor films through said gate insulating film after said step (h) and before said step (i).

5. The method of manufacturing a thin film transistor device according to claim 1, further comprising forming a gate insulating film on said first and second semiconductor films after said step (a) and before said step (b),
   wherein in said step (b), said resist film is formed on said first and second semiconductor films through said gate insulating film.

* * * * *